(12) United States Patent
Ikeuchi

(10) Patent No.: US 7,559,044 B2
(45) Date of Patent: Jul. 7, 2009

(54) AUTOMATIC DESIGN METHOD OF SEMICONDUCTOR INTEGRATED CIRCUIT, AUTOMATIC DESIGN SYSTEM OF SEMICONDUCTOR INTEGRATED CIRCUIT, AND SEMICONDUCTOR INTEGRATED CIRCUIT

(75) Inventor: Atsuhiko Ikeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 11/646,321

(22) Filed: Dec. 28, 2006

(65) Prior Publication Data
US 2007/0168895 A1  Jul. 19, 2007

(30) Foreign Application Priority Data
Dec. 28, 2005  (JP) ............................. 2005-378920

(51) Int. Cl.
*G06F 17/50* (2006.01)
(52) U.S. Cl. .................. 716/5; 716/2; 716/11; 716/12
(58) Field of Classification Search ............ 716/2, 716/5, 11, 12
See application file for complete search history.

(56) References Cited

U.S. PATENT DOCUMENTS

| 6,588,005 | B1 * | 7/2003 | Kobayashi et al. ............ 715/12 |
| 6,952,818 | B2 | 10/2005 | Ikeuchi |
| 2005/0031976 | A1 | 2/2005 | Kotani |
| 2006/0123380 | A1 | 6/2006 | Ikeuchi |

FOREIGN PATENT DOCUMENTS

JP    2005-024903 A    1/2005

* cited by examiner

*Primary Examiner*—Thuan Do
(74) *Attorney, Agent, or Firm*—Foley & Lardner LLP

(57) ABSTRACT

An automatic design method of a semiconductor integrated circuit includes: increasing an interval between a plurality of wiring patterns provided on a chip region to relieve a density of the wiring patterns based on first reference information including a criterion about a restriction of wiring length and second reference information including a criterion for a reduction of defect; verifying a circuit characteristic for the result of the relief; first thickening the wiring pattern by using a first design rule having a first correction value for thickening the wiring pattern; and second thickening the wiring pattern having been thickened in said first thickening by using a second design rule having a second correction value higher than the first correction value.

18 Claims, 17 Drawing Sheets

AUTOMATIC DESIGN METHOD OF SEMICONDUCTOR INTEGRATED CIRCUIT, AUTOMATIC DESIGN SYSTEM OF SEMICONDUCTOR INTEGRATED CIRCUIT, AND SEMICONDUCTOR INTEGRATED CIRCUIT

CROSS-REFERENCE TO RELATED APPLICATIONS

This application is based upon and claims the benefit of priority from Japanese Patent Application No. 2005-378920, filed on Dec. 28, 2005, the entire contents of which are incorporated herein by reference.

BACKGROUND

1. Field

The present invention relates to an automatic design method of a semiconductor integrated circuit, an automatic design system of a semiconductor integrated circuit, and a semiconductor integrated circuit.

2. Description of the Related Art

By a recent demand for a microfabrication, even if a mask taking a shape in accordance with a layout design is used, it is hard to form, on a wafer, a pattern in accordance with the design pattern. As means for enhancing a fidelity of a design, there have widely been utilized techniques referred to as an optical proximity correction (OPC) and a process proximity correction (PPC) which serve to create a mask pattern for forming, on a wafer, a pattern in accordance with a design value (The OPC and PPC will be hereinafter referred to as "OPC").

A verification of the fidelity of the design is important for taking a countermeasure against a systematic defect which is generated due to each manufacturing step, and there is carried out a check based on a lithographic simulation as one of effective countermeasures (hereinafter referred to as a "lithographic rule check"). In the lithographic rule check, a simple lithographic simulation is executed for a pattern subjected to the OPC, and this obtained pattern is compared with a design pattern, thereby checking a shift. Consequently, a portion which might make troubles on a device basis is detected.

In recent years, in addition to a method of correcting a mask pattern, there has been proposed a technique referred to as a "target MDP processing" for correcting a target design pattern itself in accordance with a certain rule (for example, see JP-A 2005-24903 (KOKAI)). The target MDP processing serves for an easy formation on a wafer when it is predicted that specific pattern types are hard to form on the wafer, by correcting the target pattern types. The target MDP processing deforms a design pattern itself to form a pattern shape different from an original pattern shape on a wafer. Therefore, it is important that an upper limit of an amount of a correction is determined within a range causing no problem on a design basis, and the target MDP processing is used within the range.

On the other hand, a countermeasure to be taken against a random defect caused by dust stuck in a process for manufacturing a semiconductor integrated circuit has been increasingly important because of a recent microfabrication. At a step of carrying out a layout design for the semiconductor integrated circuit, various countermeasures have been started to be executed. For the countermeasures, the following is effective, that is:

(a) a contact and a via are multiplexed;
(b) a space between wirings is relieved;
(c) a wiring width is increased; and
(d) a redundant circuit is designed.

By taking each of the countermeasures of (a) to (d), it is possible to expect a reduction in a via defect probability, a reduction in a short circuit defect generation probability between wirings, a reduction in an open defect generation probability of the wiring, and an enhancement in a yield by a defect generation relief in a memory portion.

In an existing design apparatus, however, it is hard to implement the systematic defect countermeasure and the random defect countermeasure at the same time. For this reason, in a general design apparatus, the following phenomena are caused when the countermeasures of (b) and (c) are executed, for example.

(1) The processing of relieving a space between the wirings has an advantage that a design originating relationship of a cross talk can be improved and also has an advantage that the short circuit defect generation probability between the wirings can be reduced. However, a wiring length tends to be increased so that the open defect generation rate of the wiring is increased. For this reason, it is necessary to suppress an excessive increase in the wiring length, and furthermore, to increase the wiring width as a postprocessing.

(2) The processing of increasing the wiring width can be implemented by a target MDP processing through a lithographic margin viewpoint. In order to reduce the open defect generation probability of the wiring, however, it is necessary to further increase the amount of a correction by the target MDP processing. When the wiring length is increased the open defect generation probability of the wiring is increased. For this reason, it is also necessary to further increase the wiring width. However, when the amount of a correction is increased, a large number of steps are generated on the wiring pattern. As a result, the OPC cannot be processed properly so that troubles are generated in a wafer shape, and a yield is deteriorated. When generation probability of this yield deterioration caused by the above is increased, it is necessary to carry out a modifying work in a lithographic rule check for the wiring pattern extending in a large scale region. For this reason, a great deal of computer resources and processing time are required for the modification so that it is hard to carry out a verification in a practical time. At the same time, it is also impossible to disregard the influence of an increase in a wiring capacity on a circuit operation.

SUMMARY

According to an aspect of the invention, there is provided an automatic design method of a semiconductor integrated circuit including: increasing an interval between a plurality of wiring patterns provided on a chip region to relieve a density of the wiring patterns based on first reference information including a criterion about a restriction of wiring length and second reference information including a criterion for a reduction of defect; verifying a circuit characteristic for the result of the relief; first thickening the wiring pattern by using a first design rule having a first correction value for thickening the wiring pattern; and second thickening the wiring pattern having been thickened in said first thickening by using a second design rule having a second correction value higher than the first correction value.

According to another aspect of the invention, there is provided an automatic design system of a semiconductor integrated circuit including: a relieving unit configured to increase an interval between a plurality of wiring patterns provided on a chip region to relive a density of the wiring patterns, based on first reference information including a criterion about a restriction of wiring length and second reference information including a criterion for a reduction of defect; a chip verifying unit configured to verify a circuit characteristic for the result of the relief; and a thickening unit configured to perform a first thickening process to thicken the wiring pattern by using a first design rule having a first correction value for thickening the wiring pattern and a second thickening process to thicken the wiring pattern having been thickened in the first thickening process by using a second design rule having a second correction value higher than the first correction value.

According to a further aspect of the invention, there is provided a semiconductor integrated circuit including: a semiconductor substrate; a first wiring pattern taking a shape of a band which is provided on the semiconductor substrate; a second wiring pattern taking a shape of a band which is provided apart from the first wiring pattern in parallel therewith; and a third wiring pattern including a band-shaped portion disposed apart between the first and second wiring patterns and having a greater line width than the first and second wiring patterns, a first inclined portion which is linked to the band-shaped portion and has a width increased gradually toward a direction of an arrangement of the first wiring pattern in a direction of an extension of the band-shaped portion extended in parallel with the first wiring pattern, a second inclined portion which is linked to the first inclined portion and extended obliquely toward a direction of an arrangement of the second wiring pattern with respect to the direction of the extension of the band-shaped portion, and a wide portion which is linked to the second inclined portion, is extended in parallel with the band-shaped portion and has a greater line width than the band-shaped portion.

DETAILED DESCRIPTION

Figure 1:
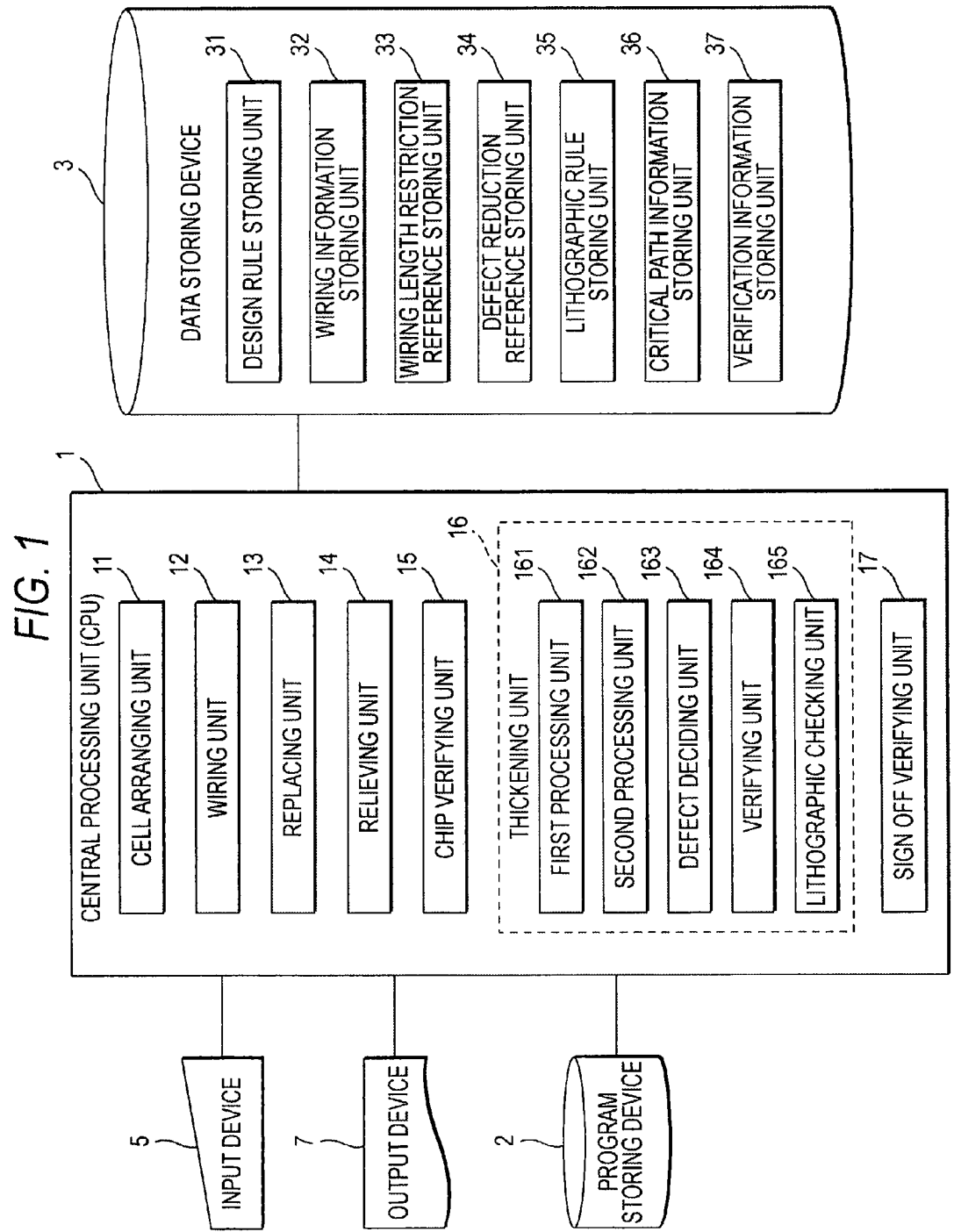
FIG. 1 is a block diagram showing an automatic design system according to an embodiment of the invention.

Next, an embodiment of the invention will be described with reference to the drawings. In the following description of the drawings, the same or similar portions have the same or similar reference numerals. Moreover, the drawings are typical and attention is to be paid to the fact that a relationship between a thickness and a mean dimension and a ratio of thicknesses of respective layers are different from actual ones. Moreover, it is a matter of course that the mutual drawings include portions in which a relationship between mutual dimensions and a ratio thereof are different. In the embodiment which will be described below, there will be described an apparatus and method for embodying the technical idea of the invention, and the technical idea of the invention does not specify a material, a shape, a structure and an arrangement of a component described in the embodiment.

<Automatic Design System>

As shown in FIG. 1, an automatic design system of a semiconductor integrated circuit according to the embodiment of the invention includes a relieving unit 14, a chip verifying unit 15, and a thickening unit 16. The relieving unit 14 reads wiring length restriction reference information and defect reduction reference information from a data storing device 3, and increases an interval between a plurality of wiring patterns provided on a chip region, thereby relieving a density of the wiring patterns. The chip verifying unit 15 verifies a circuit characteristic including a timing and a cross talk for a result of the relief. The thickening unit 16 reads a result of the verification from a verification information storing unit 37 to thicken the wiring pattern by using a first design rule and to further thicken the wiring pattern subjected to the thickening by using a second design rule having a greater correction value than that in the first design rule.

The relieving unit 14, the chip verifying unit 15 and the thickening unit 16 can be included as a part of a central processing unit (CPU) 1 of a computer system. The CPU 1 is connected to an input device 5 that receives an input from an operator, an output device 7 that outputs a result of a processing of the CPU 1 and a result of a layout of a chip, and a program storing device 2 that stores various programs required for a calculation processing of the CPU 1. The CPU 1 further includes a cell arranging unit 11, a wiring unit 12, a replacing unit 13 and a sign off verifying unit 17.

The cell arranging unit 11 reads design information such as a floor plan and cell connection information which are stored in the data storing device 3 and arranges a logic cell, a macro cell and an input/output cell in a chip region of a semiconductor integrated circuit disposed virtually in a memory space of the automatic design system in FIG. 1. The cell arranging unit 11 may arrange a high yield cell in which an external shape of a cell and positions of arrangement of an element and a wiring included in the cell are previously optimized in consideration of a yield.

The wiring unit 12 has a plurality of wiring patterns disposed in a wiring region including a plurality of layers which is assigned onto the chip region, and connects the wiring patterns of different layers to each other through a single via. The "single via" represents a via hole to be used in the case that the wiring patterns of upper and lower layers are connected to each other in one portion.

The replacing unit 13 extracts the single via provided by the wiring unit 12, and replaces the single via which can be replaced with a multiple via. The "multiple via" indicates a via hole to be used in the case in which the wiring patterns of the upper and lower layers are connected to each other in a plurality of portions.

The relieving unit 14 reads a result of the wiring executed by the wiring unit 12 and the replacing unit 13, and increases an interval between the wiring patterns. More specifically, the relieving unit 14 reads the wiring length restriction reference information stored in the data storing device 3. The relieving unit 14 then increases the interval between the wiring patterns within a range that meets the conditions of a wiring length of the wiring pattern not exceeding an upper limit value of the wiring length restriction reference. Consequently, it is possible to prevent an excessive increase in the wiring length which is caused by the processing of relieving the wiring pattern. The wiring length restriction reference information (first reference information) includes a criterion about a restriction of wiring length. For the wiring length restriction reference information, it is possible to utilize information about a reference value in relation to a rate of a permission of a wiring extension for a total length of the wiring patterns provided in the whole chip region. The reference value is optionally set by a designer.

It is preferable that the relieving unit 14 read the defect reduction reference information stored in the data storing device 3 to increase the interval between the wiring patterns corresponding to the reference value of the defect reduction reference information. The defect reduction reference information (second reference information) includes a criterion for a reduction of defect. For the defect reduction reference information, for example, it is possible to use a critical area value (a CA value) extracted from short-circuit defect information and open defect information about the wiring and the via which are caused by a random defect of the semiconductor integrated circuit. Moreover, the relieving unit 14 may have a lithographic checking function for simulating a shape of a pattern manufactured on a substrate.

The chip verifying unit 15 reads the result of the wiring executed by the relieving unit 14 and verifies an operation of a timing and a cross talk of the semiconductor integrated circuit. It is preferable that the chip verifying unit 15 calculates wiring information about a pattern shape of the wiring pattern which is thickened previously and verify an operation by referring to a design rule stored in the data storing device 3 which will be described below. Moreover, it is preferable that the chip verifying unit 15 extracts information about the wiring pattern to be a critical path in the chip region from the result of the operation verification and cause the data storing device 3 to store critical path information.

The thickening unit 16 includes first processing unit. 161, a second processing unit 162, a defect deciding unit 163, a verifying unit 164 and a lithographic checking unit 165. The first processing unit 161 and the second processing unit 162 thicken the pattern shape of the wiring pattern by using a design rule referred to as a "target MDP rule" stored in the data storing device 3.

The design rule (the target MDP rule) according to the embodiment includes at least two types, that is, first and second design rules. The first design rule is a "lithographic viewpoint rule" illustrated in FIGS. 2 to 6. The second design rule is a "defect reduction viewpoint rule" intended for reducing a random defect, and the second design rule further thickens the pattern shape easily causing a defect such as an open or a short circuit by increasing a correction value greater than that in the lithographic viewpoint rule (the first design rule) illustrated in FIGS. 2 to 6.

The first processing unit 161 reads the lithographic viewpoint rule (the first design rule) from the data storing device 3, thereby thickening the pattern shape of the wiring pattern. FIGS. 2 to 6 show an example in which the first processing unit 161 executes the processing of correcting a wiring pattern 10 on the chip region by using the lithographic viewpoint rule.

Figure 2:
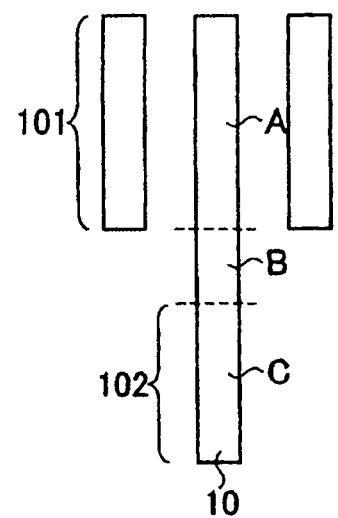
FIG. 2 is a diagram showing a design pattern example in the case in which a correction processing is carried out by using a first design rule of the automatic design system according to the embodiment of the invention.

The first processing unit 161 divides the wiring pattern 10 to be a processing object as shown in FIG. 2. The wiring pattern 10 has a dense pattern 101 and an isolated pattern 102. Therefore, the first processing unit 161 divides the wiring pattern 10 to be the processing object into a portion A including a dense pattern, a portion C constituting the isolated pattern 102, and their middle portion B.

Figure 3:
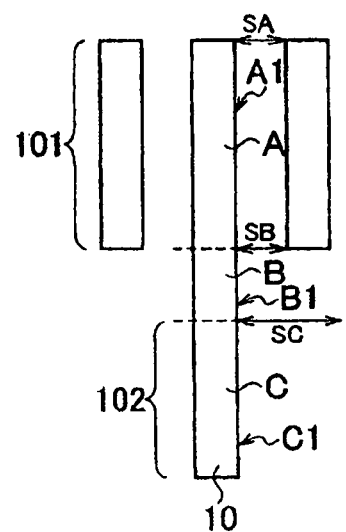
FIG. 3 is a diagram showing a design pattern example in the case in which the correction processing is carried out by using the first design rule of the automatic design system according to the embodiment of the invention.
Figure 4:
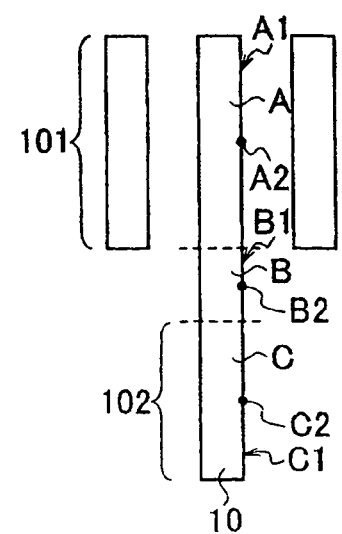
FIG. 4 is a diagram showing a design pattern example in the case in which the correction processing is carried out by using the first design rule of the automatic design system according to the embodiment of the invention.
Figure 5:
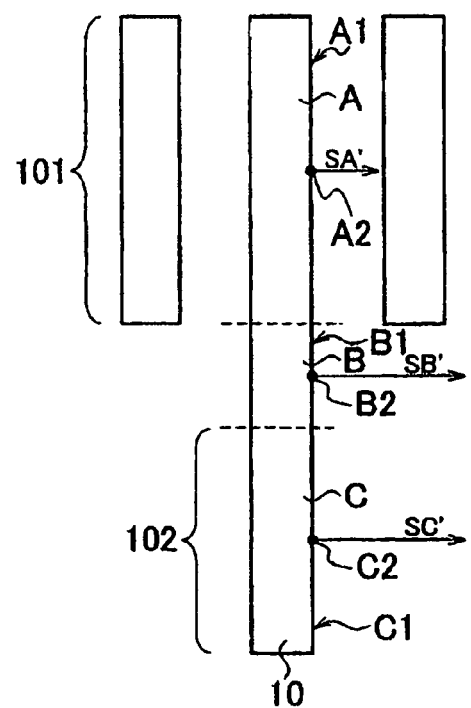
FIG. 5 is a diagram showing a design pattern example in the case in which the correction processing is carried out by using the first design rule of the automatic design system according to the embodiment of the invention.
Figure 6:
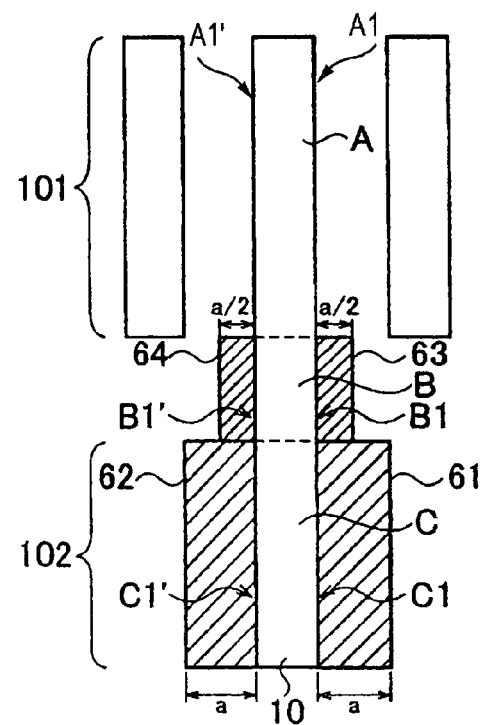
FIG. 6 is a diagram showing a design pattern example in the case in which the correction processing is carried out by using the first design rule of the automatic design system according to the embodiment of the invention.

As shown in FIG. 3, subsequently, the first processing unit 161 measures first distances SA, SB and SC between ends of edges A1, B1 and C1 of the portions A, B and C in the wiring pattern 10 and patterns in their vicinity (adjacently) measured in a direction perpendicular to the edges A1, B1 and C1 at the ends thereof. As shown in FIG. 4, furthermore, the first processing unit 161 extracts middle points A2, B2 and C2 of the edges A1, B1 and C1. As shown in FIG. 5, then, there are measured second distances SA', SB' and SC' between middle points A2, B2 and C2 of the edges A1, B1 and C1 and patterns measured in a direction perpendicular to the edges A1, B1 and C1 at the middle points A2, B2 and C2.

Next, the first processing unit 161 compares the first distances SA, SB and SC and the second distances SA', SB' and SC'. In the examples of FIGS. 3 and 5, SA=SA', SB<SB' and SC=SC' are set.

For example, a reference distance between an edge and a pattern in the vicinity thereof is classified into S1, S2 and S3, and S1<S2<S3 is set. In this case, a correction value is represented as "a" when an actual distance S between the edge and the pattern in the vicinity thereof is set to be S1<S≦S2 and a correction value is represented as "b" when the actual distance S is set to be S2<S≦S3. If SA (SA')≦S1 and S1<SC≦S2 are set, the first processing unit 161 applies the correction value of "a" to the edge C1.

Subsequently, the first processing unit 161 defines a correction value for an edge judged to be the first distance is smaller than the second distance corresponding to a distance from patterns in the vicinity thereof. For example, the correction value is represented as a/2 when the actual distance S between the edge and the pattern in the vicinity thereof is S1<S≦S2, and the correction value is represented as b/2 when the actual distance S is S2<S≦S3. In the example of FIG. 5, assuming that S1<SB≦S2 is set, the first processing unit 161 adds the correction value of a/2 to the edge B1. The same processing is also carried out over the other edges A1', B1' and C1' of the wiring pattern 10. Consequently, the first processing unit 161 adds a correction value based on a lithographic viewpoint to an intermediate portion (the portion B) present between the dense pattern 101 and the isolated pattern 102.

The second processing unit 162 reads the defect reduction viewpoint rule (a second design rule) from the data storing device 3 and further thickens the pattern shape of the wiring pattern. A processing using the defect reduction viewpoint rule is substantially the same as the processing using the lithographic viewpoint rule illustrated in FIGS. 2 to 6. However, in the defect viewpoint rule, it is possible to thicken the pattern shape by adding larger correction values for the pattern than the lithographic viewpoint rules in consideration of the random defect countermeasure of the semiconductor integrated circuit.

The defect deciding unit 163 reads a result of the wiring executed by the first processing unit 161 and the second processing unit 162 and decides whether the result of the wiring satisfies a predetermined defect reduction reference value or not. The verifying unit 164 reads the result of the wiring decided by the defect deciding unit 163 and verifies a timing and a cross talk. The lithographic checking unit 165 reads the result of the wiring verified by the verifying unit 164 and carries out a simulation analysis based on lithographic rule information stored in the data storing device 3.

The sign off verifying unit 17 reads sign off analysis information stored in the data storing device 3 and carries out a timing verification and a sign off verification such as an IR drop for the result of the wiring executed by the thickening unit 16.

The data storing device 3 includes a design rule storing unit 31, a wiring information storing unit 32, a wiring length restriction reference storing unit 33, a defect reduction reference storing unit 34, a lithographic rule storing unit 35, a critical path information storing unit 36 and a verification information storing unit 37.

The design rule storing unit 31 stores connecting information about a cell, a wiring and a via, a floor plan and a target MDP processing rule. The wiring information storing unit 32 stores a result of the wiring executed by the automatic design system in FIG. 1. The wiring length restriction reference storing unit 33 stores a reference value of wiring length extending restriction information. The defect reduction reference storing unit 34 stores a defect reduction reference value concerning quantity of a random defect or a systematic defect. The lithographic rule storing unit 35 stores a lithographic rule. The critical path information storing unit 36 stores information about a critical path which is extracted by the chip verifying unit 15. The verification information storing unit 37 stores various information required for a verification result and a verification.

The input device 5 shown in FIG. 1 includes a keyboard, a mouse, a write pen or a flexible disk device. A designer can designate input/output data through the input device 5 and can set a numerical value required for an automatic design. Moreover, it is also possible to set a layout parameter such as a format of output data or to input an instruction for executing and stopping a calculation through the input device 5. The output device 7 includes a display and a printer. The program storing device 2 stores the input/output data, the layout parameter and a history thereof, and data in the middle of the calculation.

<Design Method>

An example of an automatic design method of a semiconductor integrated circuit using the design apparatus shown in FIG. 1 will be described with reference to flowcharts shown in FIGS. 7 to 9.

Figure 7:
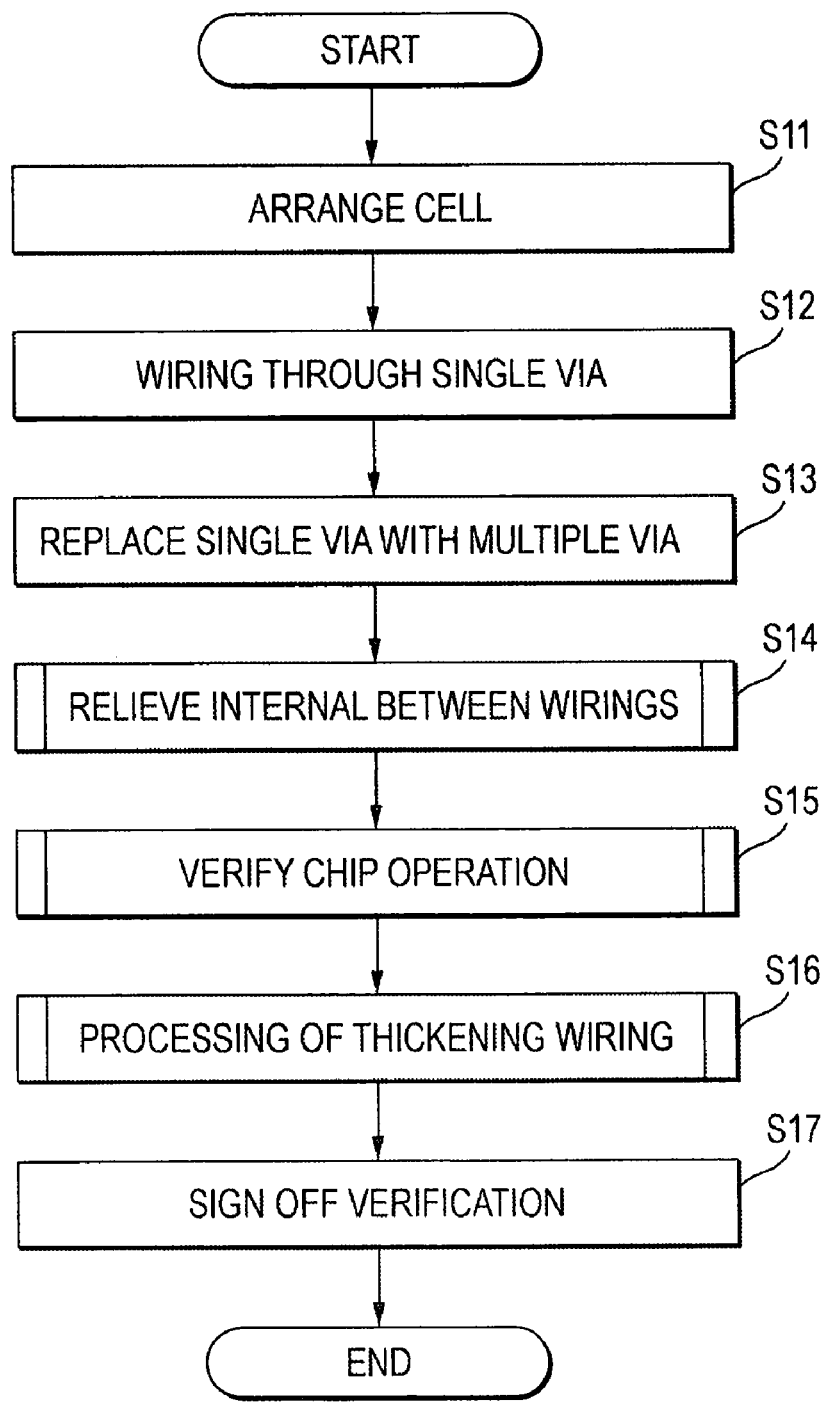
FIG. 7 is a flowchart showing an automatic design method according to the embodiment of the invention.

(A) At Step S11 of FIG. 7, the cell arranging unit 11 reads the design information stored in the design rule storing unit 31, arranges a logic cell and a micro cell in a chip region, and stores a result of the arrangement in the wiring information storing unit 32.

(B) At Step S12, the wiring unit 12 reads the result of the arrangement of the cell stored in the wiring information storing unit 32 and the design information stored in the design rule storing unit 31, provides a wiring pattern in a wiring region having a plurality of layers on the chip region, connects the wiring patterns having different layers to each other through a single via, and stores a result of the wiring in the wiring information storing unit 32.

(C) At Step S13, the replacing unit 13 reads the result of the wiring stored in the wiring information storing unit 32 and the replacement information of the via stored in the design rule storing unit 31, extracts a single via, replaces, with a multiple via, a single via which can be replaced, and stores the result of the wiring which is obtained after the replacement in the wiring information storing unit 32.

(D) At Step S14, the relieving unit 14 reads the result of the wiring obtained after the multiple via replacement stored in the wiring information storing unit 32 and increases an interval between the wiring patterns, thereby relieving a density between the wiring patterns and storing a result of the relief in the wiring information storing unit 32. The details of the Step S14 will be described below.

(E) At Step S15, the chip verifying unit 15 reads the result of the relief of the wiring pattern executed by the relieving unit 14, verifies an operation such as a timing and a cross talk of the semiconductor integrated circuit, and stores a result of the verification in the verification information storing unit 37. The details of the Step S15 will be described below.

(F) At Step S16, the thickening unit 16 reads the result of the verification obtained by the chip verifying unit 15 from the verification information storing unit 37 and thickens a pattern shape of at least a part of the wiring pattern based on the lithographic viewpoint rule (the first design rule) and the defect reduction viewpoint rule (the second design rule) which are stored in the design rule storing unit 31. Then, a result of the wiring which is obtained after the thickening is stored in the wiring information storing unit 32. The details of the Step S16 will be described below.

(G) At Step S17, the sign off verifying unit 17 reads the sign off analysis information stored in the verification information storing unit 37 and carries out a timing verification of the result of the wiring executed by the thickening unit 16 and a sign off verification such as an IR drop.

—Details of Step S14—

Figure 8:
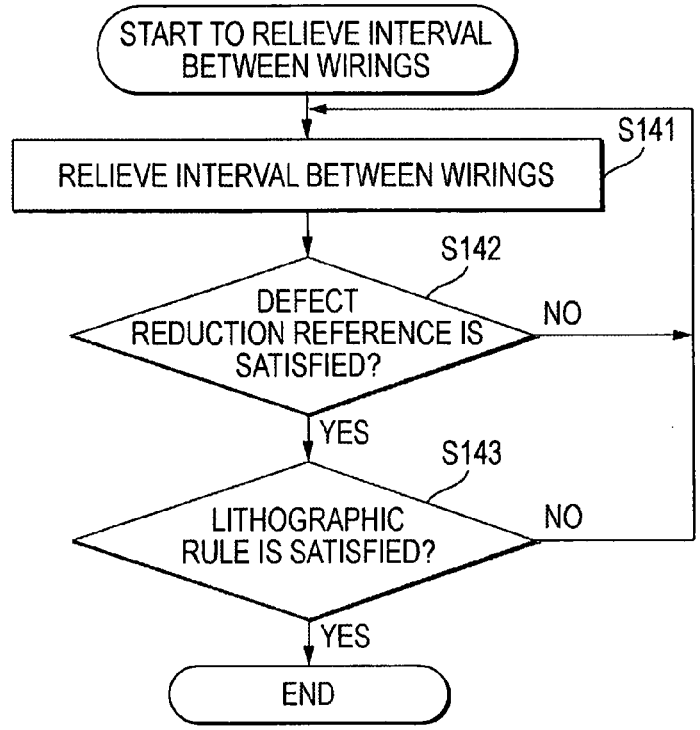
FIG. 8 is a flowchart showing the details of a wiring interval relieving processing in Step S14 of FIG. 7.

At Step S141 shown in FIG. 8, the relieving unit 14 reads the wiring length restriction reference information stored in the wiring length restriction reference storing unit 33 and the result of the wiring which is stored in the wiring information storing unit 32, increases the interval between the wiring patterns within such a range that the wiring length does not exceed the upper limit value of the wiring length restriction reference, relieves the density of the wiring patterns, and stores a result of the relief in the wiring information storing unit 32.

At Step S142, the relieving unit 14 reads the defect reduction reference information stored in the defect reduction reference storing unit 34 and decides whether the result of the relief is more than the defect reduction reference value or not. Description will be given to the case in which the defect reduction reference value is set to 10% reduction of a CA value of a short circuit defect of a wiring which is caused by a random defect, for example. The relieving unit 14 compares a CA value extracted from wiring information obtained before the relief with a CA value extracted from wiring information obtained after the processing of relieving a wiring pattern at the Step S141, and the processing proceeds to Step S143 if the CA value is reduced by 10% or more. If the CA value is not reduced by 10% or more, the processing of relieving a wiring pattern is executed again at the Step S141. A result of the wiring which is obtained after the decision is stored in the wiring information storing unit 32.

At the Step S143, the reliving unit 14 reads the lithographic rule stored in the lithographic rule storing unit 35 and carries out a lithographic rule check over a result of the wiring which is obtained after the decision in the Step S142. If the result of the wiring does not satisfy the lithographic rule, the processing returns to the Step S141 and the processing of relieving a wiring pattern is carried out again. If the result of the wiring satisfies the lithographic rule, the processing of relieving a wiring interval at the Step S14 is ended and the processing proceeds to a processing of verifying a chip operation shown in the Step S15.

—Details of Step S15—

Figure 9:
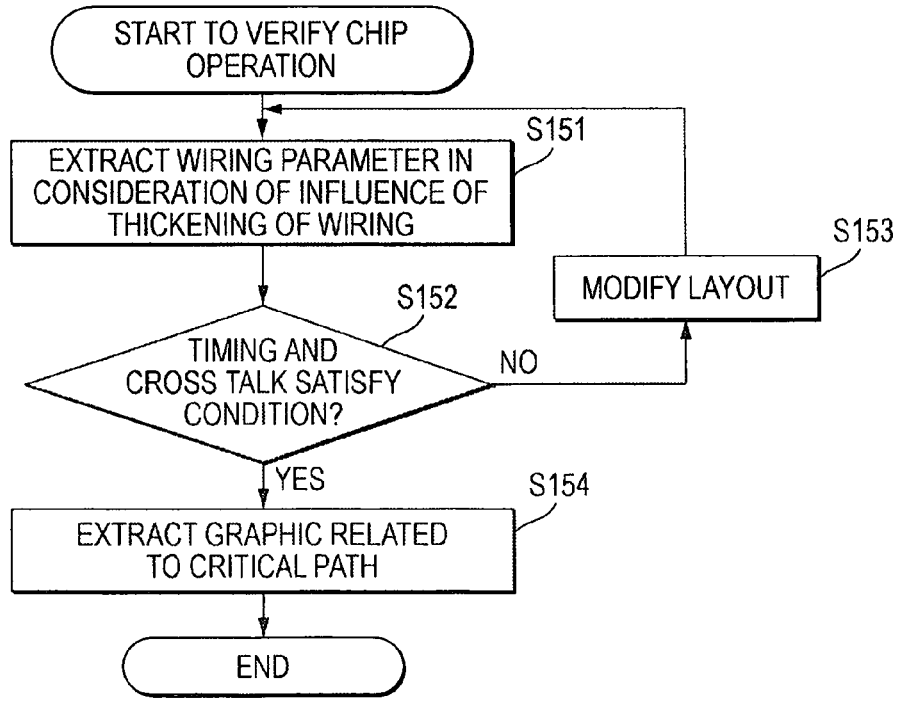
FIG. 9 is a flowchart showing the details of a chip operation verification in Step S15 of FIG. 7.

At Step S151 of FIG. 9, the chip verifying unit 15 reads the lithographic viewpoint rule (the first design rule) stored in the design rule storing unit 31 and the result of the wiring after the relief of the wiring which is stored in the wiring information storing unit 32. Then, the chip verifying unit 15 extracts the wiring parameter after the relief of the wiring, based on the lithographic viewpoint rule.

At Step S152, the chip verifying unit 15 reads the wiring parameter extracted at the Step S151 and carries out a timing verification and a cross talk verification based on the verification information stored in the verification information storing unit 37. If the timing verification and the cross talk verification satisfy a certain condition, the processing proceeds to the Step S154. If they do not satisfy the certain condition, the layout (wiring information) is modified at Step S153 and the processing then returns to the Step S151.

At the Step S154, the chip verifying unit 15 reads the wiring information obtained after the verification, extracts information about a wiring pattern to be a critical path in a chip region and stores the extracted information in the critical path information storing unit 36.

—Details of Step S16—

Figure 10:
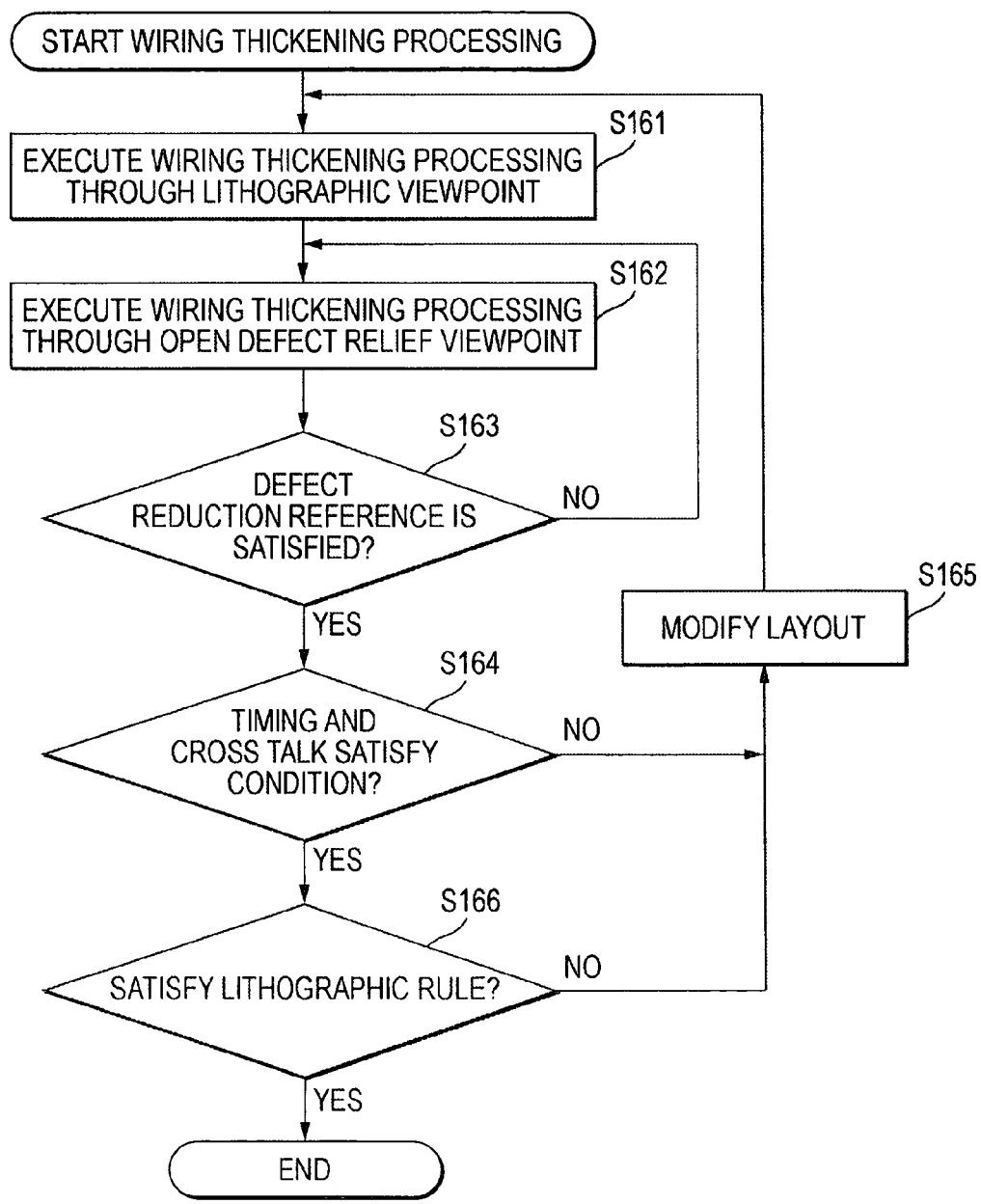
FIG. 10 is a flowchart showing the details of a wiring thickening processing in Step S16 of FIG. 7.
Figure 11:
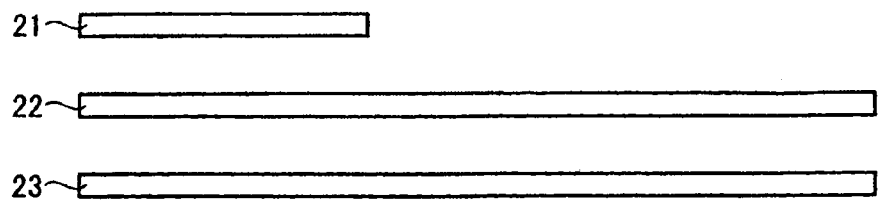
FIG. 11 is a view showing a design pattern example in which the wiring thickening processing according to the embodiment of the invention is executed.
Figure 12:
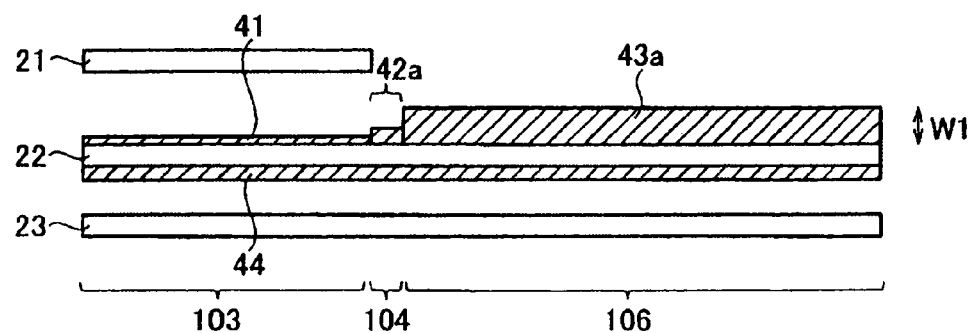
FIG. 12 is a view showing a design pattern example according to an example of the case in which the wiring thickening processing is executed by using a first design rule in accordance with the embodiment of the invention.

At Step S161 of FIG. 10, the first processing unit 161 reads the lithographic viewpoint rule (the first design rule) from the design rule storing unit 31 and thickens the pattern shape of the wiring pattern stored in the wiring information storing unit 32. As a specific example, description will be given by taking a first layout shown in FIGS. 11 to 13 as an example. In the layout of FIG. 11, wiring patterns 21, 22 and 23 are extended respectively in parallel, and, as shown in FIG. 12, have a dense region 103, an isolated region 106 and a middle region 104.

In case that a noted wiring is set to be the wiring pattern 22, the first processing unit 161 adds a correction pattern 41 to an edge of the wiring pattern 22 present in the dense region 103 on a opposite side to the wiring pattern 21. A correction pattern 43a having a greater line width W1 than the correction pattern 41 is added to an edge of the wiring pattern 22 present in the isolated region 106. A correction pattern 42a having a greater line width than the correction pattern 41 and a smaller line width than the correction pattern 43a is added to the middle region 104 interposed between the regions 103 and 106. A correction pattern 44 is added to an edge of the wiring pattern 22 on an opposite side to the wiring pattern 23.

Figure 13:
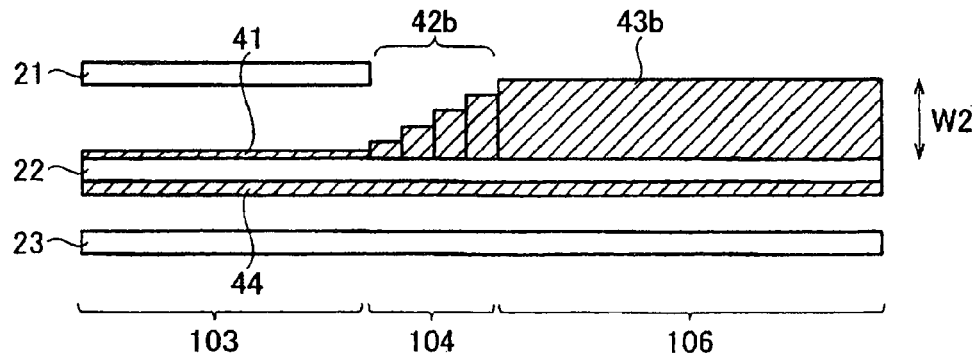
FIG. 13 is a view showing a design pattern example according to an example of the case in which the wiring thickening processing is executed by using a second design rule in accordance with the embodiment of the invention.

At Step S162, the second processing unit 162 reads the defect reduction viewpoint rule (the second design rule) from the design rule storing unit 31 and further thickens the pattern shape of the wiring pattern. For example, as shown in FIG. 13, the second processing unit 162 adds a correction pattern 43b having a greater line width W2 than the correction pattern 43a in FIG. 12. A step-shaped correction pattern 42b is added to the middle region 104 between the region 103 in which the wiring patterns 21, 22 and 23 are provided densely and the isolated region 106.

Figure 19:
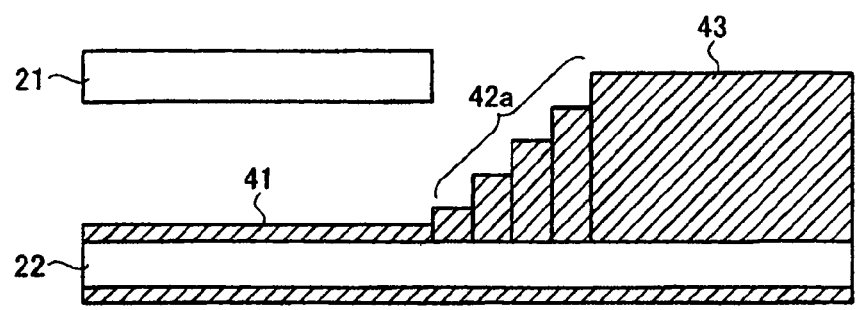
FIG. 19 is a view showing a design pattern example in the case in which the wiring thickening processing according to the embodiment of the invention is executed.
Figure 20:
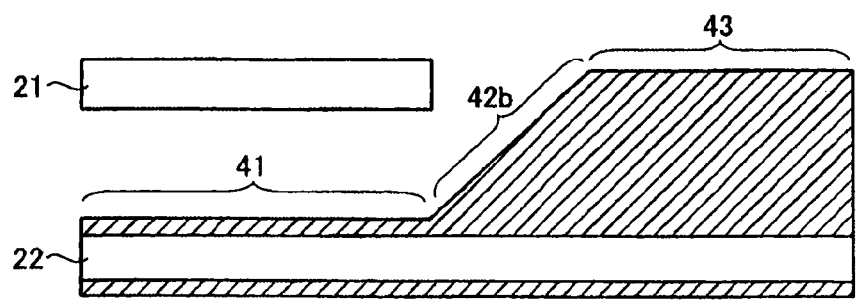
FIG. 20 is a view showing a design pattern example in the case in which the wiring thickening processing according to the embodiment of the invention is executed.

In case that a plurality of steps is included in the pattern shape obtained after the processing, the second processing unit 162 may carry out a correction processing in order to connect respective vertices of the steps and form an inclined correction pattern as is illustrated in FIGS. 19 and 20. As a condition for connecting the vertices of the steps, it is also possible to add a restricting condition for adding a correction pattern in the case in which an inclination angle of an inclined portion obtained after the correction is 45 degrees seen from an original wiring pattern.

Moreover, the second processing unit 162 may read information about a wiring pattern to be a critical path in the chip region from the critical path information storing unit 36 and limit the processing of thickening the wiring pattern to be the critical path (critical net) corresponding to a positional relationship with another wiring pattern (non-critical net) which is adjacent to the critical net.

Furthermore, the second processing unit 162 may properly change a position of the wiring pattern to be noted by using the defect reduction rule capable of varying an arrangement position in response to a distance from another wiring pattern adjacent to the wiring pattern to be noted. A result of the thickened wiring is stored in the wiring information storing unit 32.

At Step S163, the defect deciding unit 163 reads a result of the wiring executed by the second processing unit 162 from the wiring information storing unit 32 and decides whether the result of the wiring satisfies a predetermined defect reduction reference value (exceeds a reference value) or not. If the defect reduction reference value is not satisfied, the pattern shape of the wiring pattern is thickened again at the Step S162. If the defect reduction reference value is satisfied, the processing proceeds to Step S164.

At the Step S164, the verifying unit 164 reads the verification information stored in the verification information storing unit 37 and carries out a timing verification and a cross talk verification for the result of the wiring obtained after the defect decision in the Step S163. If the condition is not satisfied as a result of the timing verification and the cross talk verification, a layout modification is carried out at Step S165. After the layout modification, the first processing unit 161 thickens the pattern shape of the wiring pattern again at the Step S161. If the condition is satisfied as a result of the verification, the processing proceeds to Step S166.

At the Step S166, the lithographic checking unit 165 reads the result of the wiring which is obtained after the decision of the defect deciding unit 163 and carries out a simulation analysis based on the lithographic rule information stored in the data storing device 3. If the pattern that does not satisfy the lithographic rule is present as a result of the analysis, the processing of thickening a wiring pattern in the Step S161 is carried out after the layout modification in the Step S165. If the lithographic rule is satisfied as a result of the analysis, the step S16 is ended and the processing then proceeds to the sign off verification shown in the Step S17.

According to the automatic design method of a semiconductor integrated circuit in accordance with the embodiment, the relieving unit 14 executes the processing of relieving a density of a wiring pattern based on the wiring length restriction reference information in the wiring relieving processing shown in the Step S14. Therefore, it is possible to prevent an excessive increase in a wiring length. Moreover, the relieving unit 14 decides whether the short circuit defect reduction reference value between the wirings is satisfied or not, for example. Consequently, it is possible to reduce a generation probability of a defect caused by the random defect.

In the chip operation verification processing shown in the Step S15, the wiring parameter is previously extracted based on the first and second design rules to be used in the processing of thickening a wiring pattern to be executed at the Step S16. Consequently, it is possible to shorten a time required for the operation verification shown in the Step S164. Moreover, the critical path related graphic extraction processing shown in the Step S154 is carried out. In the processing of thickening a wiring pattern shown in the Step S16, consequently, it is possible to prevent an excessive correction processing from being carried out over the wiring pattern to be the critical path. Thus, it is possible to reduce the influence of an increase in a capacity between the wirings on a circuit operation.

In the processing of thickening a wiring pattern shown in the Step S16, moreover, it is possible to reduce the defect generation rate of the wiring, and at the same time, to enhance a yield by thickening the wiring pattern using the rules including at least two types, that is, the lithographic viewpoint rule (the first design rule) and the defect reduction viewpoint rule (the second design rule). The lithographic viewpoint rule and the defect reduction viewpoint rule take a consistency without a competition as the design rules. Even if the first and second design rules are combined, therefore, it is possible to carry out the correction processing without causing a drawback and an inconsistency.

FIRST LAYOUT EXAMPLE

FIG. 13 shows a first layout example which can be designed by using the automatic design method according to the embodiment. The second processing unit 162 sets the correction value of the correction pattern 43b to be added to the wiring pattern 22 in the isolated region 106 to be greater than the reference value of the lithographic viewpoint rule (see the correction pattern 43a in FIG. 12) to form the step-shaped correction pattern 42b to be added to the wiring pattern 22 in the middle region 104. As compared with the layout shown in FIG. 12 using only the first design rule, consequently, it is possible to reduce the generation probability of the short circuit defect between the wirings which is caused by the systematic defect or the random defect.

Figure 14:
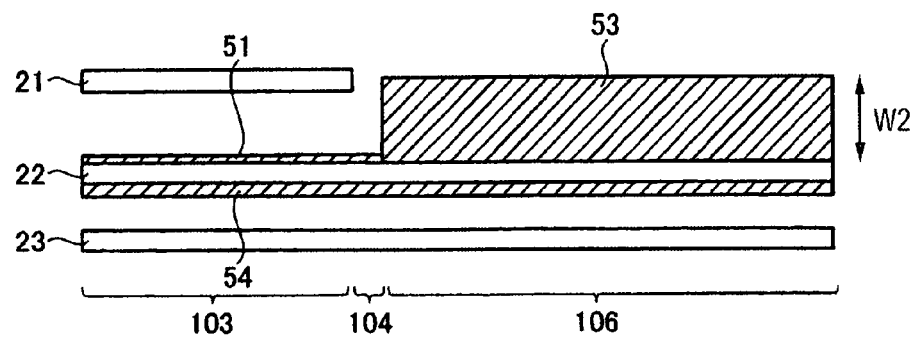
FIG. 14 is a view showing a design pattern example, illustrating a comparative example in the case in which the wiring thickening processing is executed by using a conventional design rule.
Figure 15:
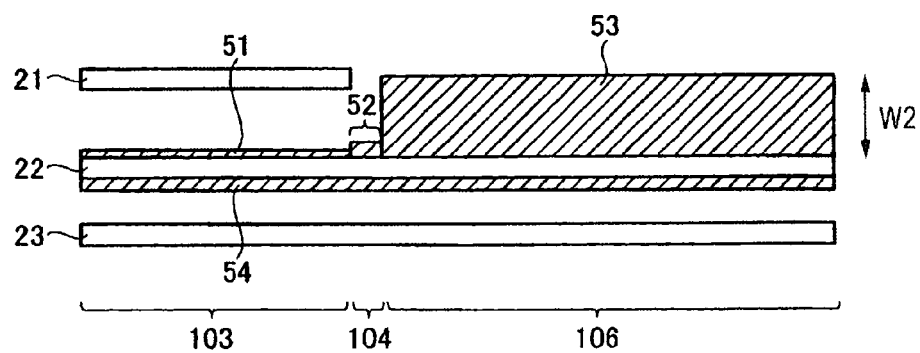
FIG. 15 is a view showing a design pattern example, illustrating a comparative example in the case in which the wiring thickening processing is executed by using the conventional design rule.

As a comparative example, FIGS. 14 and 15 show a layout example processed by the method to which the processes of the embodiment is not applied. In FIG. 14, a correction pattern 53 having the line width W2 is added to the edge of the wiring pattern 22 in the isolated region 106 and the step-shaped correction pattern is not added to the middle region 104 between the region 103 in which the wiring patterns 21, 22 and 23 are provided densely and the isolated region 105. On the other hand, in FIG. 15, the correction pattern 53 having the line width W2 shown in FIG. 13 is added. However, the line width of a correction pattern 52 disposed in the middle region 104 is smaller than that of the correction pattern 42b in FIG. 13.

Figure 16:
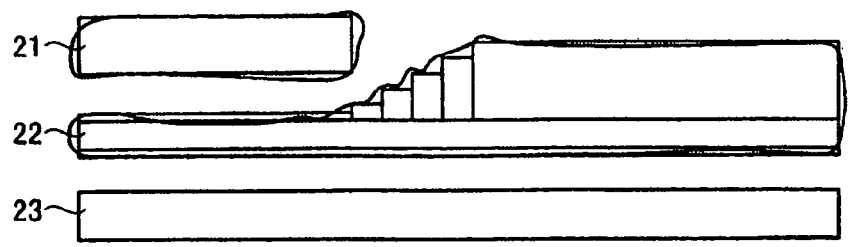
FIG. 16 is a view showing a design pattern example according to an example of a result obtained by executing a lithographic simulation for the design pattern of FIG. 13.
Figure 17:
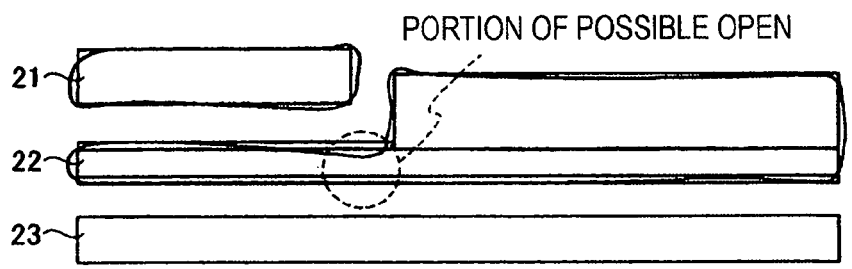
FIG. 17 is a view showing a design pattern example according to an example of a result obtained by executing the lithographic simulation for the design pattern of FIG. 14.
Figure 18:
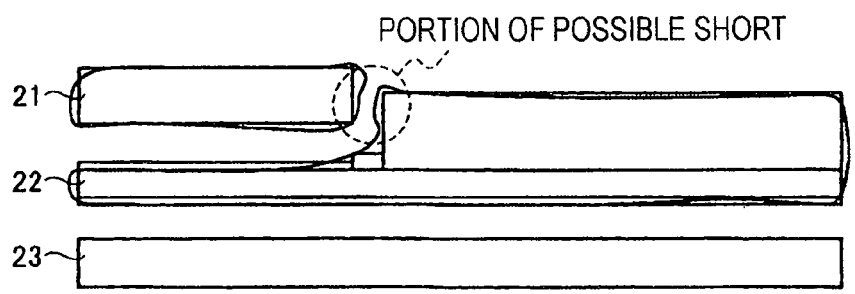
FIG. 18 is a view showing a design pattern example according to an example of a result obtained by executing the lithographic simulation for the design pattern of FIG. 15.

FIG. 16 shows a result obtained by executing a lithographic simulation for the layout illustrated in FIG. 13. In the example, shown in FIG. 16, it is apparent that generation of portions of possible open and short circuit of the wiring patterns 21, 22 and 23 are avoided. On the other hand, in the example shown in FIG. 17 in which the lithographic simulation is executed for the layout of FIG. 14, the portion of possible open is generated on the wiring pattern 22. In an example shown in FIG. 18 in which the lithographic simulation is executed for the layout of FIG. 15, furthermore, the portion of possible short circuit is generated between the wiring patterns 21 and 22.

SECOND LAYOUT EXAMPLE

With reference to FIGS. 19 to 22, description will be given to a second layout example in which a design can be carried out by using the automatic design method according to the embodiment. A correction pattern 42a of a layout shown in FIG. 19 includes steps. It is hard to carry out a transfer to a substrate in accordance with an original pattern so that a portion of possible defect is generated in some cases. Therefore, the second processing unit 162 carries out a correction to connect the respective vertices of the steps included in the correction pattern 42a shown in FIG. 19, thereby forming an inclined pattern. Thus, a correction pattern 42b is formed as shown in FIG. 20. An angle of an inclined edge of the correction pattern 42b seen in a direction of an extension of the wiring pattern 22 is about 45 degrees.

Figure 21:
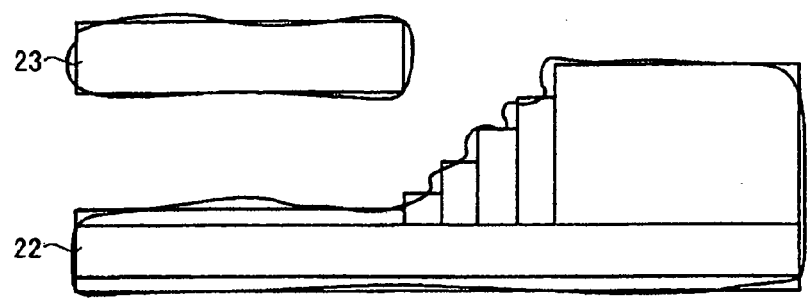
FIG. 21 is a view showing a design pattern example according to an example of a result obtained by executing the lithographic simulation for the design pattern of FIG. 19.
Figure 22:
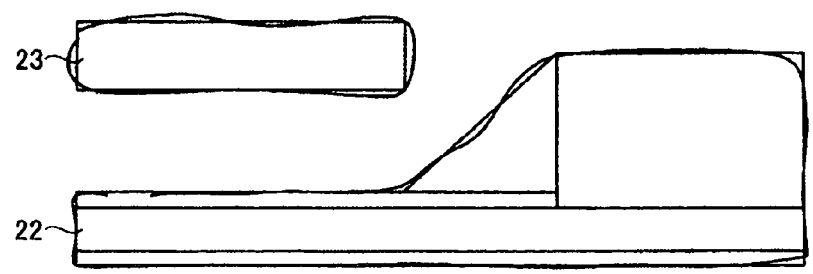
FIG. 22 is a view showing a design pattern example according to an example of a result obtained by executing the lithographic simulation for the design pattern of FIG. 20.

For layouts shown in FIGS. 19 and 20, a result obtained by executing the lithographic simulation is shown in FIGS. 21 and 22. In the lithographic simulation shown in FIG. 21., a step-shaped pattern is included. Therefore, mask drawing data are increased. On the other hand, in a result obtained by the lithographic simulation shown in FIG. 22, the step-shaped pattern is not included. Therefore, it is possible to suppress the increase in the mask drawing data.

THIRD LAYOUT EXAMPLE

Figure 23:
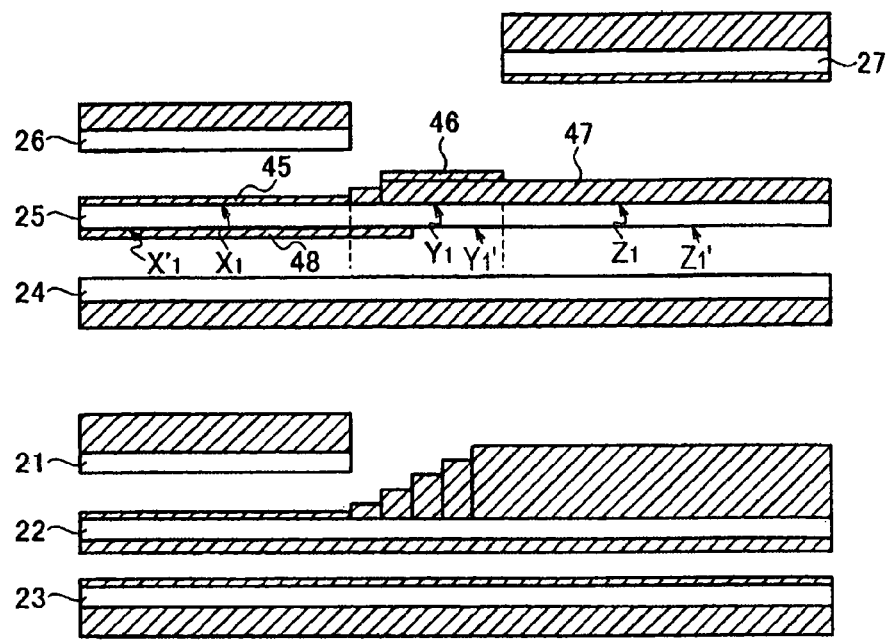
FIG. 23 is a view showing a design pattern in the case in which a correction is carried out in consideration of critical path information in the wiring thickening processing according to the embodiment of the invention.

With reference to FIG. 23, description will be given to a third layout example which can be designed by using the automatic design method according to the embodiment. In the layout example of FIG. 23, wiring patterns 21, 22, 23, 24, 25, 26, and 27 are disposed in parallel with each other. Description will be given to the case in which the wiring pattern 25 is concerned in the critical path.

A correction of the wiring pattern 25 concerned in a critical net is limited to a correction using only the lithographic viewpoint rule which is required at a minimum and a correction using the defect reduction viewpoint rule is not carried out. For this reason, correction patterns 45, 46, 47 and 48 are added onto edges X1, Y1, Z1 and X1' of the wiring pattern 25, respectively. However, the correction is not carried out over a part of an edge Y1' and an edge Z1' which are opposed to the adjacent wiring pattern 24. On the other hand, referring to the other wiring patterns 21 to 24, 26 and 27, a correction using both the lithographic viewpoint rule and the defect related rule is carried out. Thus, the thickening unit 16 limits the processing of thickening the pattern shape of the wiring pattern 25 related to the critical path. Consequently, it is possible to suppress the correction of opposed sides of the wiring which is adjacent to the wiring on the critical path. Therefore, it is apparent that an expansion of the wiring pattern can be suppressed and an excessive increase in the capacity between the wirings can be controlled.

FOURTH LAYOUT EXAMPLE

Figure 24:
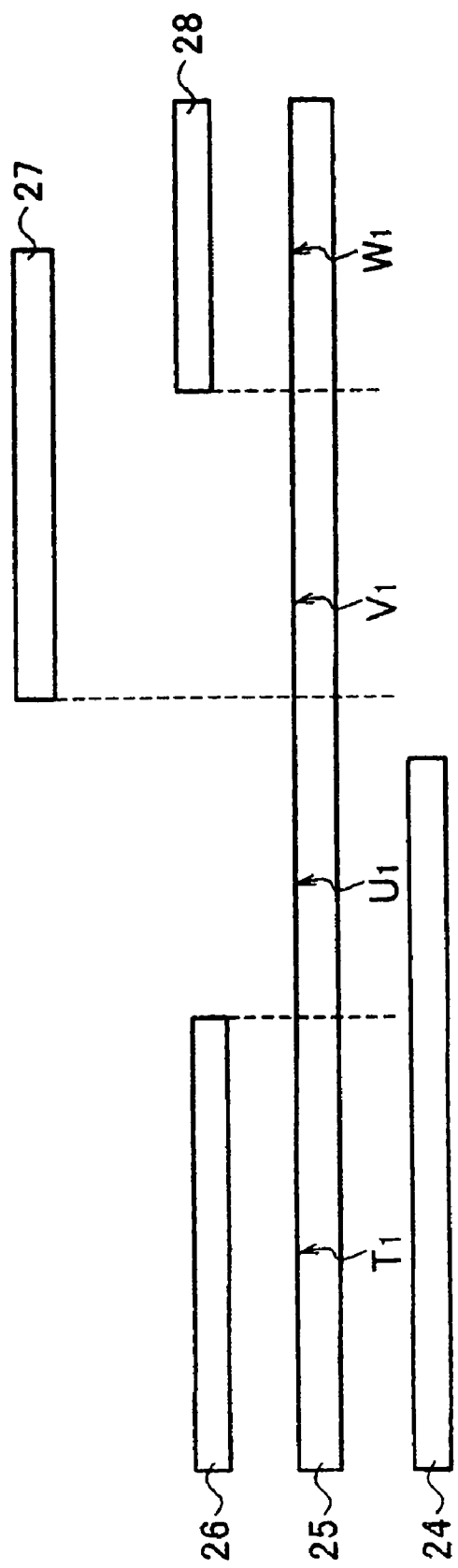
FIG. 24 is a view showing a design pattern example in which a wiring processing according to the embodiment of the invention is executed.
Figure 25:
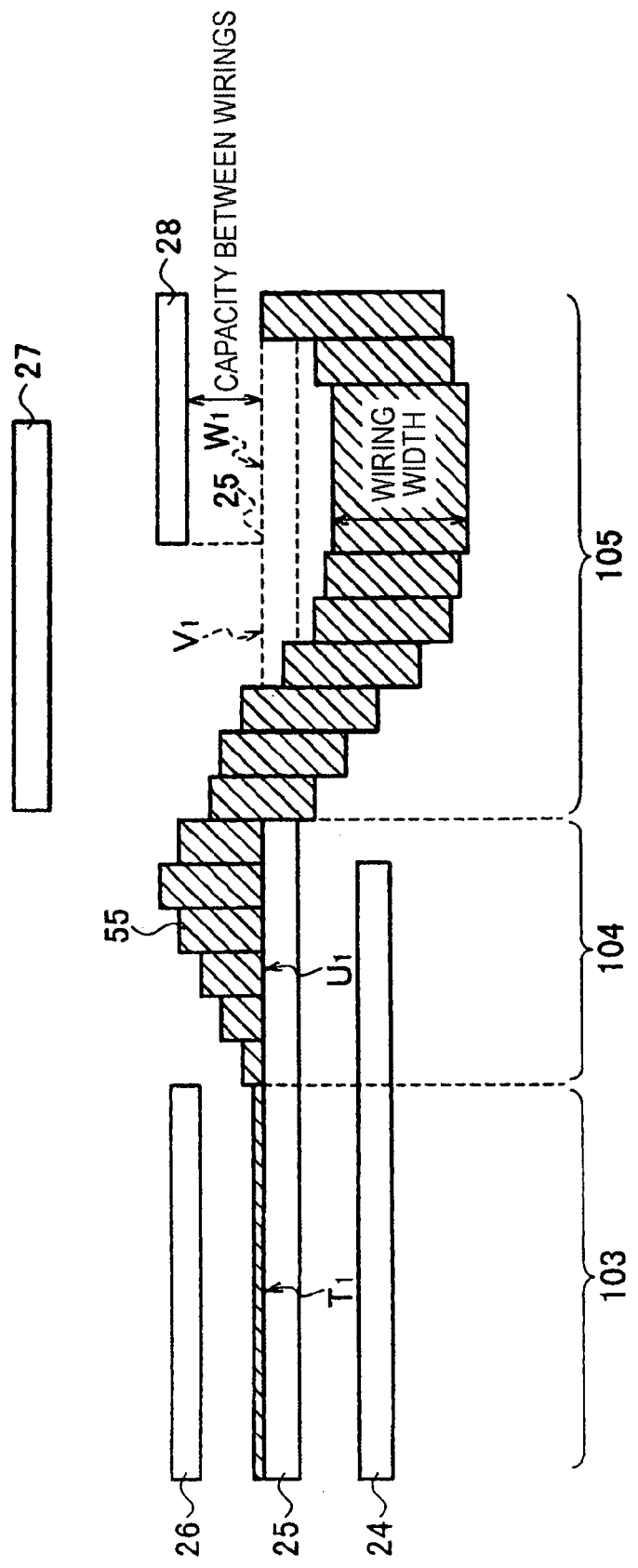
FIG. 25 is a view showing a design pattern example according to an example of the case in which the wiring thickening processing is carried out by using a second design rule in accordance with the embodiment of the invention.
Figure 26:
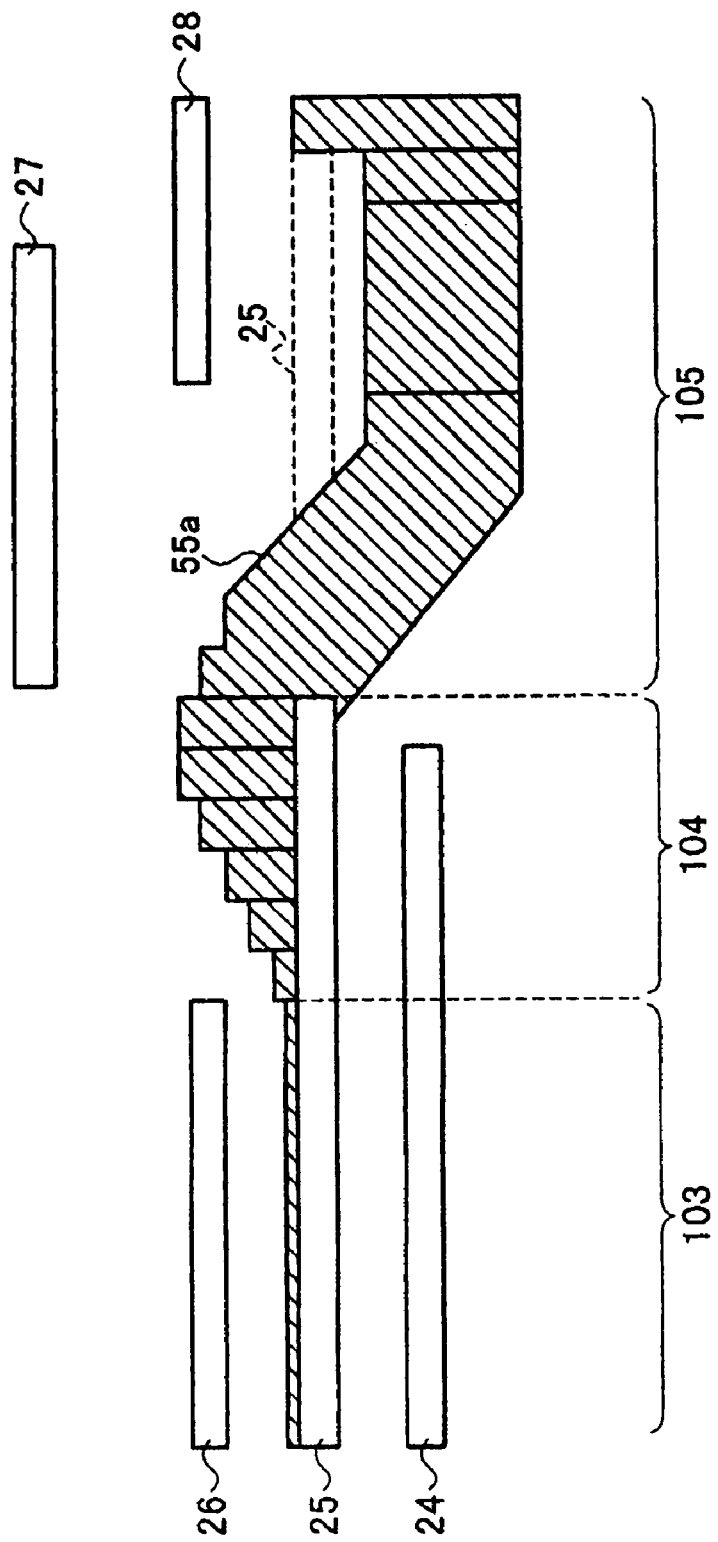
FIG. 26 is a view showing a design pattern example according to an example of the case in which the wiring thickening processing is carried out by using the second design rule in accordance with the embodiment of the invention.

With reference to FIGS. 24 to 26, description will be given to a fourth layout example which can be designed by using the automatic design method according to the embodiment. In the layout example of FIG. 24, wiring patterns 24, 25, 26, 27 and 28 are disposed in parallel with each other. Description will be given to the case in which the wiring pattern 25 is set to be a noted wiring. The second processing unit 162 divides an area of an edge of the wiring pattern 25 into a plurality of edges T1, U1, V1 and W1 by using the defect reduction viewpoint rule stored in the design rule storing unit 31, for example. Based on a relationship of a distance between the edges T1 to W1 and adjacent wirings, a correction pattern 55 of the wiring pattern 25 is formed as shown in FIG. 25. In this case, the second processing unit 162 keeps a wiring portion which can be separated from the adjacent wiring pattern 28 away therefrom stepwise, thereby implementing a line width which is intended.

In FIG. 25, the wiring pattern 25 and the wiring pattern 28 are adjacent to each other. An adjacent wiring is not present on a side of the wiring pattern 25 in an isolated region 105 which is not opposed to the wiring pattern 28. For this reason, the second processing unit 162 changes positions of the edges V1 and W1 in accordance with a distance from the adjacent wiring. As shown in FIG. 26, furthermore, the second processing unit 162 executes the correction processing to connect respective vertices of a plurality of steps of the correction pattern 55, thereby forming an inclined pattern. Thus, a capacity of mask drawing data can be reduced. Consequently, it is possible to suppress an increase in the mask drawing data and to execute a lithographic simulation in an actual time.

<Mask Pattern>

Figure 27:
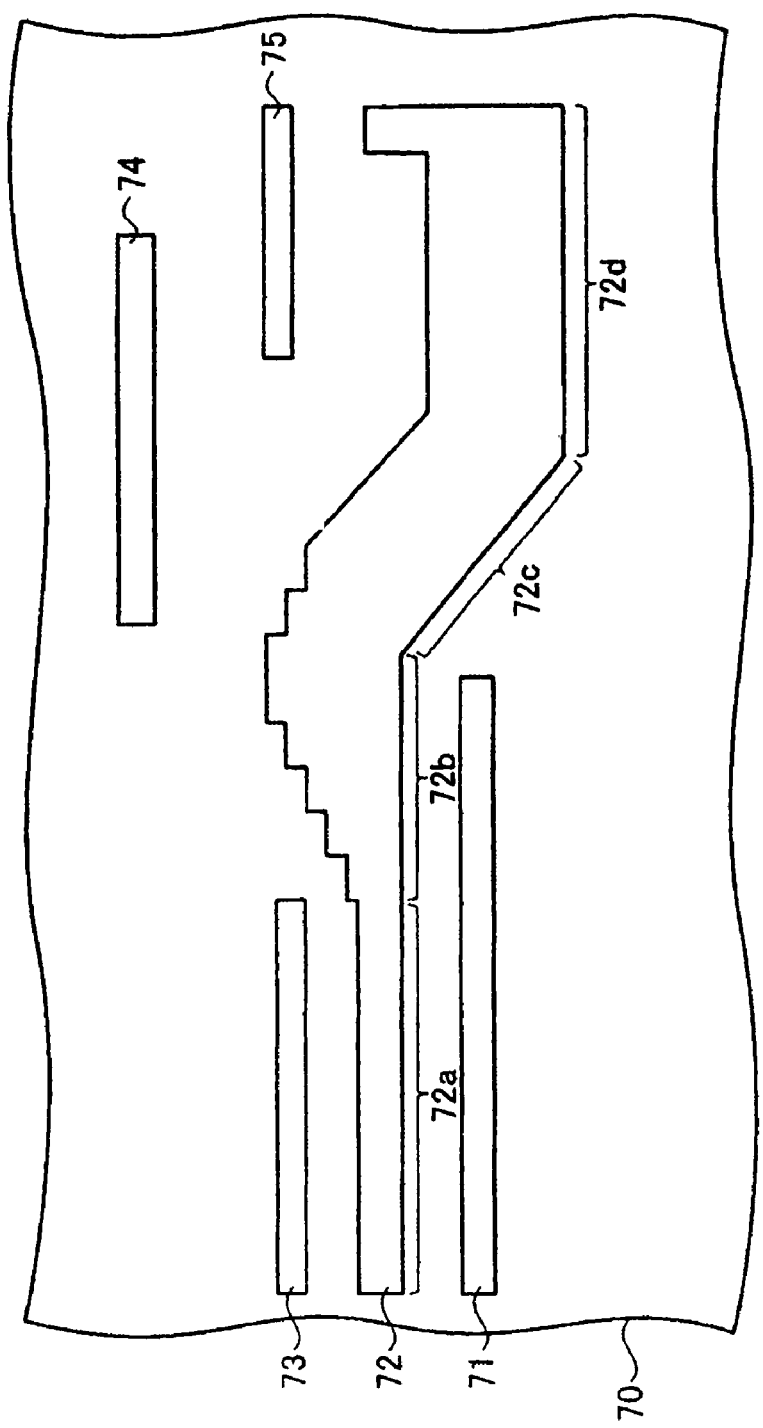
FIG. 27 is an explanatory view showing an example of a reticle manufactured by using the automatic design system and method according to the embodiment of the invention.

FIG. 27 shows an example of a mask (reticle) manufactured by means of a pattern generator using layout data designed by the automatic design apparatus or the automatic design method according to the embodiment. Description will be given to an example of a mask pattern fabricated based on the fourth layout example shown in FIG. 26. Actually, FIG. 27 simply shows one of a large number of reticles forming a set. FIG. 27 illustrates a pattern for a positive resist. If a negative resist is used in FIG. 27, it is a matter of course that white and black are inverted in the pattern of FIG. 27. By using a mask shown in FIG. 27 to pattern a photoresist applied onto a semiconductor substrate and utilizing, as a mask, the photoresist subjected to the patterning to carry out etching through RIE, moreover, it is possible to manufacture a semiconductor integrated circuit including a wiring structure shown in FIG. 27.

As shown in FIG. 27, a mask 70 has a first wiring pattern 73 for drawing a first wiring in the semiconductor integrated circuit, a second wiring pattern 71, a third wiring pattern 72, a fourth wiring pattern 74 and a fifth wiring pattern 75 disposed as patterns formed by shielding films such as chromium (Cr) and chromium oxide ($Cr_2O_3$) on a mask substrate such as a quartz glass. The patterns formed by the shielding films can be formed by drawing a photoresist provided on the shielding film through a pattern generator such as an electronic beam lithographic apparatus and etching the shielding film through reactive ion etching (RIE) using the pattern of the photoresist as a mask.

The second wiring pattern 71 is provided apart in parallel with the first wiring pattern 73. The third wiring pattern 72 is disposed between the first wiring pattern 73 and the second wiring pattern 71. The third wiring pattern 72 has a band-shaped portion 72a, a first inclined portion 72b, a second inclined portion 72c and a wide portion 72d. The band-shaped portion 72a has a greater line width than the first and second wiring patterns 73 and 71. The first inclined portion 72b is linked to the band-shaped portion 72a and is formed in such a manner that a line width is gradually increased from a direction of an extension of the band-shaped portion 72a toward a direction of an arrangement of the first wiring pattern 73. The second inclined portion 72c is linked to the first inclined portion 72b and is extended obliquely from the direction of the extension of the band-shaped portion 72a toward a direction of an arrangement of the second wiring pattern 71. The wide portion 72d is linked to the second inclined portion 72c and is extended in parallel with the band-shaped portion 72a, and has a greater line width than the band-shaped portion 72a.

The mask pattern according to the embodiment is manufactured by using the layout data in which the problems of the circuit operation such as a systematic defect, a random defect and a cross talk are improved. Therefore, it is possible to easily carry out a transfer onto the substrate in accordance with a design pattern. Thus, it is possible to enhance a manufacturing yield.

<Method of Manufacturing Semiconductor Integrated Circuit>

With reference to a flowchart of FIG. 28, description will be given to an example of a method of manufacturing a semiconductor integrated circuit using the automatic design system shown in FIG. 1. A method of manufacturing a semiconductor storing apparatus which will be described below is only illustrative and it is a matter of course that the embodiment can be implemented by using various other manufacturing methods in addition to the variant.

At Step S100, a layout design of the semiconductor integrated circuit is carried out. More specifically, as described with reference to the flowchart of FIG. 7, the cell is disposed in the chip region at the Step S1, and the wiring region having a plurality of layers is provided on the chip region and is connected through a single via at the Step S12. At the Step S13, the single via is replaced with the multiple via. At the Step S14, the interval between the wiring patterns is increased in order to relieve the density of a plurality of wiring patterns provided on the chip region by using the wiring length restriction reference information and the defect reduction reference information.

At the Step S15, moreover, the design rule for thickening at least a part of the wiring pattern shape is read from the data storing device 3, and a circuit characteristic of a result of the relief which is calculated by applying the design rule is verified.

At the Step S16, furthermore, the wiring pattern obtained after the verification is thickened by using the first design rule, and the wiring pattern which is thickened is further thickened by using the second design rule having a greater correction value than that in the first design rule stored in the data storing device 3.

At the Step S17, moreover, there are executed various sign off verifications, for example, a circuit verification, an LVS/DRC verification, an OPC/MDP verification, an IR drop and a lithographic verification, and a preparation for the mask data is completed.

Figure 28:
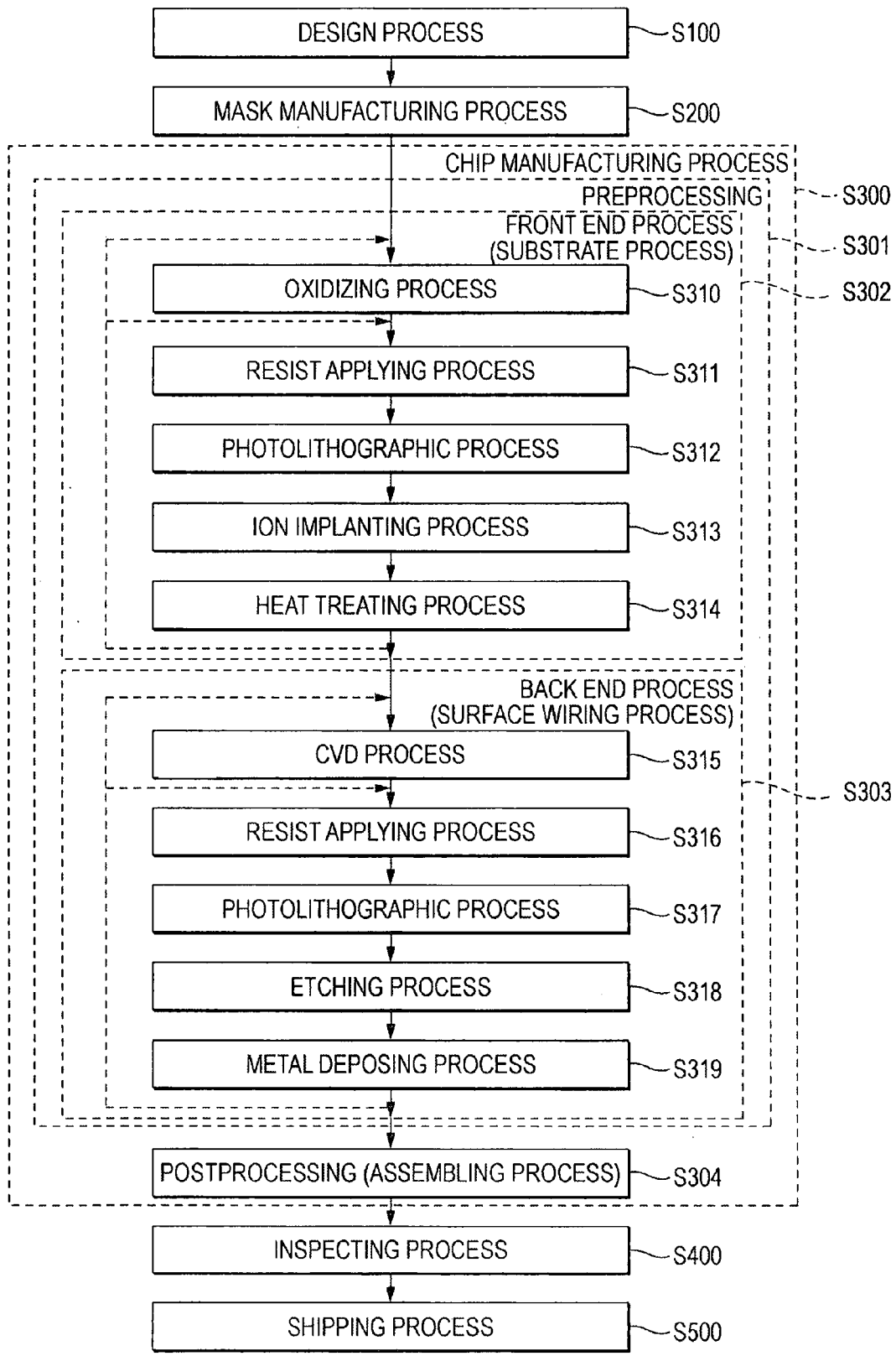
FIG. 28 is a flowchart showing an example of a method of manufacturing a semiconductor integrated circuit according to the embodiment of the invention.

At Step S200 of FIG. 28, a set including the number of masks (reticles) which is required for each of a substrate process and a wiring process is manufactured with a. predetermined adjusting margin by means of a pattern generator such as an electron beam exposing apparatus based on the mask data obtained at the Step S100.

At Step S300, there is executed a chip manufacturing process using the set of reticles manufactured at the Step S200. The chip manufacturing process includes a preprocessing shown in Step S301 and a postprocessing shown in Step S304. First of all, at a front end process (a substrate process) shown in Step S302, a silicon oxide film is selectively etched by a process of depositing a silicon oxide film on a silicon substrate in Step S310, a process of applying a photoresist film onto the silicon oxide film in Step S311 and a lithographic process using the mask formed at the Step S200 in Step S312, for example. Furthermore, various processes including an impurity ion selective implanting process using the photoresist film and the silicon oxide film as the masks in Step S313 and an activating treatment for an implanted ion in Step S314 are repeated to form a transistor of each cell.

After the front end process shown in the Step S302, a desirable pattern is drawn by means of a stepper using a necessary reticle for each process at a back end process (a surface wiring process) shown in Step S303. Consequently, a wiring processing is carried out over the surface of the substrate.

More specifically, as shown in Step S315, an insulating film is formed on a silicon substrate by a CVD method or a PVD method and a surface is flattened by a chemical mechanical polishing (CMP) method, for example. As shown in Step S316, a photoresist is applied onto an interlayer insulating film and a photoresist film obtained at a photolithographic process shown in Step S317 is subjected to patterning by using a reticle for a surface wiring in the set of reticles formed at the Step S200, for example, the reticle (the mask) shown in FIG. 27, thereby forming an etching mask.

At Step S318, the RIE is carried out by using the etching mask formed based on the reticle shown in FIG. 27. As a result, a first wiring groove for forming a first wiring which is band-shaped, a second wiring groove for forming a second wiring which is band-shaped, and a third wiring groove having a band-shaped portion, a first inclined portion, a second inclined portion and a wide portion which serves to manufacture a third wiring are provided in the interlayer insulating film. The band-shaped portion has a greater line width than the first and second wirings. The first inclined portion is linked to the band-shaped portion and has a width increased gradually toward a direction of an arrangement of the first wiring groove in a direction of an extension of the band-shaped portion extended in parallel with the first wiring groove. The second inclined portion is linked to the first inclined portion and is extended obliquely toward a direction of an arrangement of the second wiring pattern with respect to the direction of the extension of the band-shaped portion. The wide portion is linked to the second inclined portion and is extended in parallel with the band-shaped portion, and is formed to have a line width which is greater than that of the band-shaped portion.

After the photoresist is removed and the surface is washed, a metal is deposited in the first to third wiring grooves to form the first to third wirings at Step S319. A series of processes of forming a new etching mask by the photolithographic process and patterning the metal film is repeated again by using the reticles in the reticle set in order. Thus, a multilayer wiring structure is formed.

After the surface wiring process is completed, a product is shipped at Step S500 through an assembling process of the Step S304 and an inspecting process of Step S400.

According to the method of manufacturing a semiconductor integrated circuit in accordance with the embodiment, the semiconductor integrated circuit is manufactured by using the layout data to improve various problems in respect of the circuit operation such as a systematic defect, a random defect and a cross talk in the Step S100. Therefore, a manufacturing yield can be enhanced.

While the invention has been described based on the embodiment, it is to be understood that the invention is not limited to the description and the drawings which constitute a part of the disclosure. From the disclosure, various alternative embodiments, examples and application techniques are apparent to the skilled in the art.

A serial design processing shown in the flows of FIGS. 7 to 10 can be executed by controlling the automatic design system shown in FIG. 1 in accordance with a program of an equivalent algorithm to that shown in FIGS. 7 to 10. The program is stored in a computer readable recording medium and the recording medium is read by the program storing device 2 so that a serial automatic design processing for the automatic design according to the embodiment can also be executed. Furthermore, it is also possible to store the program in the program storing device 2 through a computer network such as internet.

It is a matter of course that the invention includes various embodiments which have not been described above.

What is claimed is:

1. An automatic design method of a semiconductor integrated circuit comprising:
   increasing an interval between a plurality of wiring patterns provided on a chip region to relieve a density of the wiring patterns based on first reference information including a criterion about a restriction of wiring length and second reference information including a criterion for a reduction of defect;

verifying a circuit characteristic for the result of the relief using a computer processor;
first thickening the wiring pattern by using a first design rule having a first correction value for thickening the wiring pattern; and
second thickening the wiring pattern having been thickened in said first thickening by using a second design rule having a second correction value higher than the first correction value.

2. The automatic design method according to claim 1, wherein the circuit characteristic verified in said verifying includes a timing and a cross talk.

3. The automatic design method according to claim 1, wherein said second thickening comprises thickening the wiring pattern having been thickened in said first thickening to exceed a reference value of the second reference information concerning quantity of a random defect of the semiconductor integrated circuit.

4. The automatic design method according to claim 3, wherein the reference value of the second reference information includes a reduction amount of a critical area value.

5. The automatic design method according to claim 3, further comprising:
extracting a first wiring pattern to be a critical path in the chip region and a second wiring pattern that is adjacent to the first wiring pattern by referring to the result of the verification; and
limiting the processing of thickening the first wiring pattern by referring to a positional relationship between the first wiring pattern and the second wiring pattern.

6. The automatic design method according to claim 1, further comprising:
extracting a first wiring pattern to be a critical path in the chip region and a second wiring pattern that is adjacent to the first wiring pattern by referring to the result of the verification; and
limiting the processing of thickening the first wiring pattern by referring to a positional relationship between the first wiring pattern and the second wiring pattern.

7. The automatic design method according to claim 1, wherein said second thickening comprises:
specifying a dense region in which the wiring patterns are provided densely, an isolated region in which the wiring patters are isolated each other, and a middle region between the dense region and the isolated region; and
adding a step-shaped correction pattern to the wiring pattern located in the middle region.

8. The automatic design method according to claim 7, wherein said second thickening further comprises correcting the wiring pattern to connect respective vertices of steps included in the step-shaped correction pattern to form an inclined correction pattern.

9. The automatic design method according to claim 1, wherein said second thickening comprises changing a position of a part of the wiring pattern in accordance with a distance from an adjacent wiring pattern.

10. An automatic design system of a semiconductor integrated circuit, comprising:
a relieving unit configured to increase an interval between a plurality of wiring patterns provided on a chip region to relive a density of the wiring patterns, based on first reference information including a criterion about a restriction of wiring length and second reference information including a criterion for a reduction of defect;
a chip verifying unit configured to verify a circuit characteristic for the result of the relief; and
a thickening unit configured to perform a first thickening process to thicken the wiring pattern by using a first design rule having a first correction value for thickening the wiring pattern and a second thickening process to thicken the wiring pattern having been thickened in the first thickening process by using a second design rule having a second correction value higher than the first correction value.

11. The automatic design system according to claim 10, wherein the circuit characteristic verified in the chip verifying unit includes a timing and a cross talk.

12. The automatic design system according to claim 10, wherein the thickening unit thickens the wiring pattern having been thickened in the first thickening process to exceed a reference value of the second reference information concerning quantity of a random defect of the semiconductor integrated circuit.

13. The automatic design system according to claim 12, wherein the reference value of the second reference information includes a reduction amount of a critical area value.

14. The automatic design system according to claim 12, wherein:
the chip verifying unit extracts a first wiring pattern to be a critical path in the chip region and a second wiring pattern that is adjacent to the first wiring pattern by referring to the result of the verification; and
the thickening unit limits the processing of thickening the first wiring pattern by referring to a positional relationship between the first wiring pattern and the second wiring pattern.

15. The automatic design system according to claim 10, wherein:
the chip verifying unit extracts a first wiring pattern to be a critical path in the chip region and a second wiring pattern that is adjacent to the first wiring pattern by referring to the result of the verification; and
the thickening unit limits the processing of thickening the first wiring pattern by referring to a positional relationship between the first wiring pattern and the second wiring pattern.

16. The automatic design system according to claim 10, wherein the thickening unit specifies a dense region in which the wiring patterns are provided densely, an isolated region in which the wiring patters are isolated each other, and a middle region between the dense region and the isolated region, and adds a step-shaped correction pattern to the wiring pattern located in the middle region.

17. The automatic design system according to claim 16, wherein the thickening unit corrects the wiring pattern to connect respective vertices of steps included in the step-shaped correction pattern to form an inclined correction pattern.

18. The automatic design system according to claim 10, wherein the thickening unit changes a position of a part of the wiring pattern in accordance with a distance from an adjacent wiring pattern.

* * * * *